United States Patent [19]

Karasaki et al.

[11] Patent Number: 4,672,209
[45] Date of Patent: Jun. 9, 1987

[54] COMPONENT ALIGNMENT METHOD

[75] Inventors: Koichi Karasaki; Mamoru Kobayashi, both of Hadano; Yasuhiko Hara, Machida, all of Japan

[73] Assignee: Hitachi, Ltd., Tokyo, Japan

[21] Appl. No.: 757,662

[22] Filed: Jul. 22, 1985

[30] Foreign Application Priority Data

Jul. 24, 1984 [JP] Japan .................................. 59-153466

[51] Int. Cl.⁴ ............................................ G01M 11/00
[52] U.S. Cl. ............................... 250/458.1; 250/461.1; 356/400
[58] Field of Search ............... 250/461.1, 458.1, 491.1; 356/399, 400; 378/20, 35, 68, 206

[56] References Cited

U.S. PATENT DOCUMENTS

| | | | |
|---|---|---|---|
| 3,617,744 | 11/1971 | Irish | 250/461.1 |
| 4,152,723 | 5/1979 | McMahon et al. | 250/458.1 |
| 4,595,295 | 6/1986 | Wilczynski | 356/400 |
| 4,608,494 | 8/1986 | Kobayashi et al. | 356/400 |
| 4,615,621 | 10/1986 | Allen et al. | 356/399 |

OTHER PUBLICATIONS

"Alignment Beamsplitter Cube" by Gaston IBM Technical Disclosure Bulletin vol. 25, #5 Oct. 1982.

Primary Examiner—Craig E. Church
Assistant Examiner—John C. Freeman
Attorney, Agent, or Firm—Antonelli, Terry & Wands

[57] ABSTRACT

A method for the alignment of electronic components to be mounted on a printed board. The alignment is accomplished by illuminating the surface of the printed board to cause emission of fluorescent light from the substrate of the printed board, detecting the fluorescent light by optical means to detect an image of the conductor pattern of the printed board as a negative picture, taking an image of leads of an electronic component by optical means as a positive or negative picture, and correcting the deviation of the leads of the electronic component from the conductor pattern on the basis of picture data obtained from both images.

9 Claims, 10 Drawing Figures

COMPONENT ALIGNMENT METHOD

BACKGROUND OF THE INVENTION

The present invention relates to a method for aligning electronic components, and more particularly to a method of aligning an electronic component with a printed board in which the position of a conductor pattern on the printed board and the position of each lead of the electronic component are detected by optical means.

In a typical one of the conventional methods for aligning a chip-mounted component with a printed board, the printed board is irradiated with light to form an image of a conductor pattern on the printed board by reflected light from the printed board, the component is also irradiated with light to form an image of the component by reflected light from the component, and the positional deviation of one of these images from the other image is detected to correct the position of the printed board on the basis of the deviation.

An example of conventional component alignment apparatuses for carrying out the typical method will be described below. A printed board is placed on an XY-table which is movable on a horizontal plane, and then irradiated with light. The reflected light from the printed board is led to a television camera so that an image of a conductor pattern on the printed board is formed on the television camera by the reflected light and is detected by the television camera. Next, a chip-mounted component which is to be aligned with the corresponding conductor pattern, is disposed above the printed board and coarsely aligned with the printed board. Then, the component is irradiated with light, and the television camera is moved to an appropriate position so that an image of leads of the component is formed on the television camera by the reflected light from the leads. The amounts of positional deviation of the image of the leads from the image of the conductor pattern in X- and Y-directions are determined by an appropriate processor, and the XY-table is moved so that the determined positional deviation is corrected, that is, the leads of the component are accurately located in relation to the conductor pattern on the printed board.

However, a method of this kind which utilizes the reflected light from a conductor pattern as in the case of the above-mentioned component alignment apparatus involves a substantial disadvantage. Namely, where the conductor pattern is a solder pattern, the surface condition is not uniform, and there are variations in surface condition among individual samples of the conductor pattern. In other words, there is a disadvantage that since there are variations in shape, surface luster, etc., among the different samples, the reflected light from the conductor pattern is not stable and the binarization of a video signal with respect to the conductor pattern is not an easy matter. There is another problem that depending upon a manner in which the printed board is irradiated with light, the surface of the printed board gleams thus making it difficult to distinguish the conductor pattern from the substrate of the printed board.

The present invention has been made on the basis of an idea of utilizing fluorescent light emitted from the substrate of a printed board, which occurred in the course of an investigation into any other method than the method of utilizing the reflected light from a conductor pattern.

SUMMARY OF THE INVENTION

An object of the present invention to to locate an electronic component accurately in relation to a conductor pattern on a printed board in such a manner that the printed board is irradiated with light lying in a specified wavelength range to generate fluorescent light from the substrate of the printed board, an accurate image of the conductor pattern is formed by the fluorescent light emitted from the substrate, without being affected by variations in shape, surface luster and others of the conductor pattern, and the positioning of the printed board is performed on the basis of the image of the conductor pattern.

In order to attain the above object, according to the present invention, there is provided a method of accurately locating an electronic component in relation to a conductor pattern on a printed board which comprises the steps of: irradiating the printed board with light to generate fluorescent light from the printed board; detecting an image of the conductor pattern by receiving the fluorescent light; irradiating leads of the electronic component with light from above or below the leads to obtain reflected light from the leads or transmitted light from among the leads; detecting an image of the leads by receiving the reflected light or transmitted light; and recognizing the image of the conductor pattern and the image of the leads to accurately locate the leads in relation to the conductor pattern on the basis of a positional relation between the images.

Another object of the present invention is to provide an apparatus for carrying out the above method to accurately locate an electronic component in relation to a conductor pattern on a printed board.

A further object of the present invention is to provide means capable of generating fluorescent light from a printed board and obtaining reflected light from leads of an electronic component by using common illuminating means.

In order to attain the above two objects, according to the present invention, there is provided a component alignment apparatus which comprises means for irradiating both a printed board and leads of an electronic component with light to generate fluorescent light from the printed board and to obtain reflected light from the leads, image detecting means for detecting an image of a conductor pattern on the printed board when receiving the fluorescent light, and for detecting an image of the leads when receiving the reflected light, and means for recognizing the image of the conductor pattern and the image of the leads to accurately locate the leads in relation to the conductor pattern on the basis of a positional relation between the images.

DESCRIPTION OF THE PREFERRED EMBODIMENTS

The present invention will be explained below in detail, with reference to the drawings.

Figure 1:
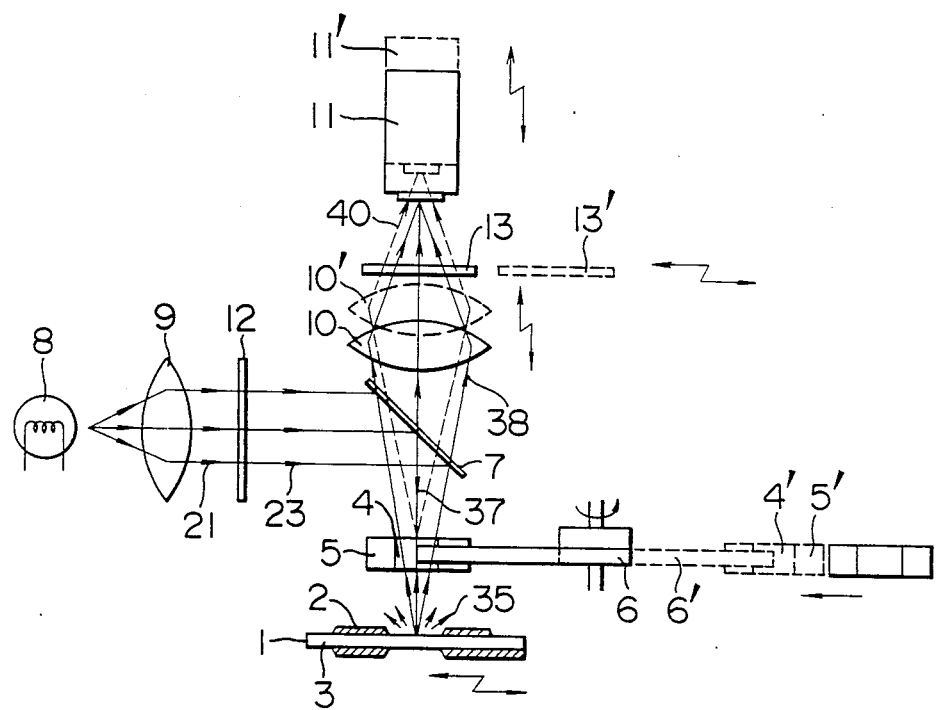
FIG. 1 is a schematic diagram of an embodiment of a component alignment apparatus according to the present invention, viewed from the front of the embodiment.

FIG. 1 is a schematic diagram of an embodiment of a component alignment apparatus according to the present invention, viewed from the front of the embodiment. Referring to FIG. 1, a conductor pattern 2 on which leads 5 of an electronic component 4 are to be mounted, is formed on a printed board 1. That is, the component 4 is to be accurately located in relation to the conductor pattern 2. A component loader 6 is first rotated to a position indicated by broken lines 6', and the component 4 is set to the loader 6 as indicated by broken lines 4'. When an image of the component 4 is formed, the loader 6 is rotated so that the component 4 is disposed above the printed board 1. An optical system which is made up of a light source 8, a lens 9 and a first filter 12, produces exciting light 23 for generating fluorescent light from a substrate 3 of the printed board 1. In more detail, light emitted from the light source 8 passes through the lens 9 to form parallel rays 21, and only those wavelength components of the parallel rays 21 which can generate fluorescent light from the substrate 3, pass through the first filter 12 to produce the exciting light 23. The exciting light 23 from the filter 12 is reflected downward from a half mirror 7. The exciting light 23 reflected from the half mirror 7 impinges on the printed board 1 or the component 4. The fluorescent light emitted from the substrate 3 of the printed board 1 by irradiating the printed board 1 with the exciting light 23, the exciting light reflected from the printed board 1 and the exciting light reflected from the component 4 can pass through the half mirror 7. Composite light 38 including the fluorescent light from the substrate 3 and the reflected light from the printed board 1 passes through the half mirror 7, and is then incident upon a focussing lens 10 to be focussed on a predetermined plane. In a case where the exciting light reflected from the component 4 passes through the half mirror 7, the lens 10 is moved to a position indicated by broken lines 10'. A second filter 13 extracts the fluorescent light from the composite light 38 having passed through the lens 10. For the reflected light from the component 4, the second filter 13 is moved to a position indicated by broken lines 13', that is, the filter 13 leaves the path of the above reflected light. A television camera 11 photographs or detects an image of the printed board 1 formed by the fluorescent light. In a case where an image of the component 4 is formed by the reflected light from the component 4, the television camera 11 is moved to a position indicated by broken lines 11' to detect the image of the component 4.

Figure 2:
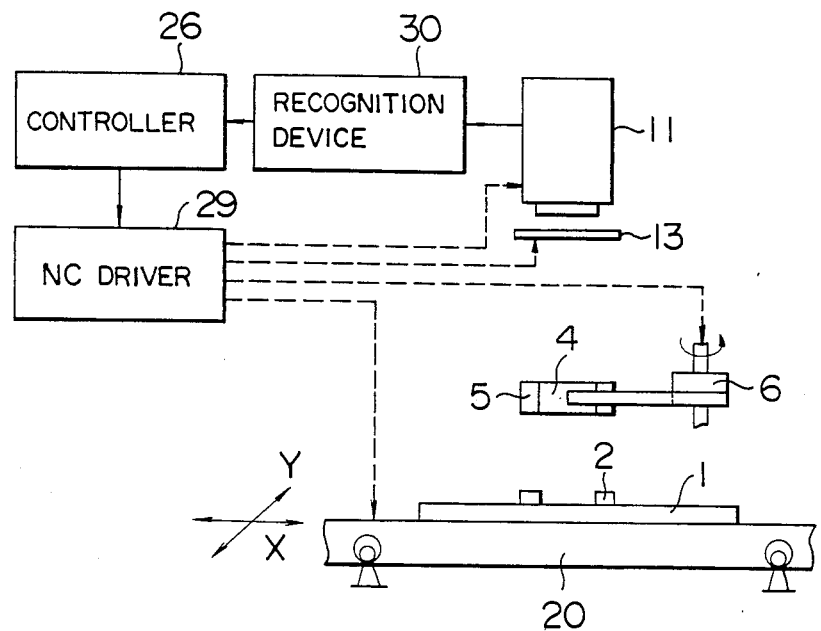
FIG. 2 is a schematic diagram showing various circuits and members attached to the embodiment of FIG. 1.

FIG. 2 shows various circuits and members attached to the embodiment of FIG. 1. Referring to FIG. 2, an XY-table 20 for mounting the printed board 1 thereon can move on a horizontal plane in an X-direction (that is, from left to right and from right to left in FIG. 2) and in a Y-direction (that is, a direction perpendicular to FIG. 2). The image of the conductor pattern photographed or detected by the television camera 11 and the image of the leads 5 photographed or detected by the television camera 11 which is placed at the position indicated by the broken lines 11', are sent to a recognition device 30, to be subjected to pattern recognition. A controller 26 calculates the amounts of positional deviation of the leads 5 from the conductor pattern 2 in X- and Y-directions on the basis of the positional information of the pattern image and lead image from the recognition device 30, and sends X- and Y-correction values for the above positional deviation to an NC driver 29. The NC driver 29 drives the XY-table 20 so that the table 20 is moved in the X-direction by the X-correction value and moved in the Y-direction by the Y-correction value. Further, the NC driver 29 drives the second filter 13, television camera 11 and component loader 6 so that these members 13, 11 and 6 are set to predetermined positions.

Figure 3:
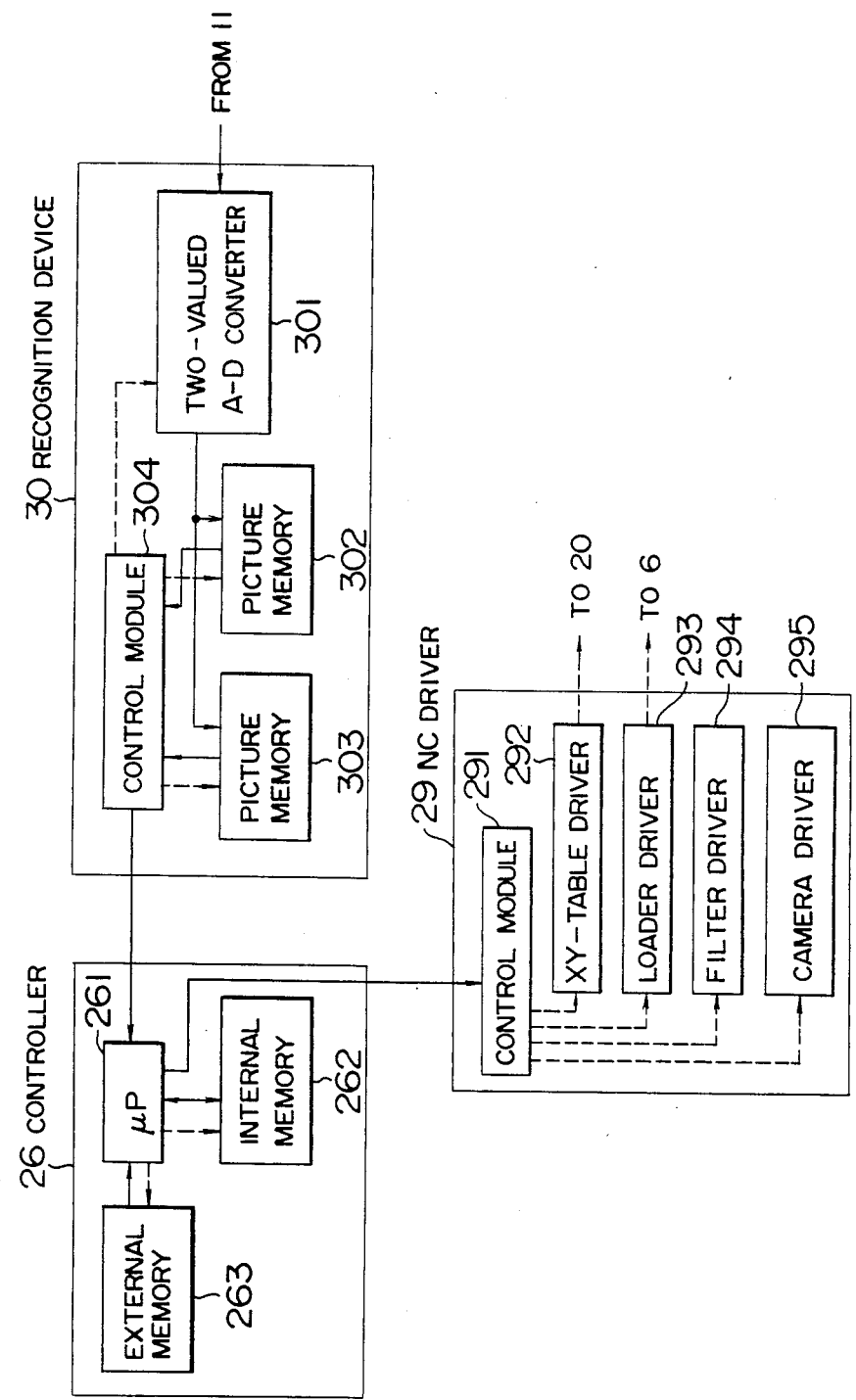
FIG. 3 is a block diagram showing the internal construction of each of the recognition device 30, controller 26 and NC driver 29 shown in FIG. 2.

FIG. 3 is a block diagram showing an example of the internal construction of the recognition device 30, controller 26 and NC driver 29. In FIG. 3, solid lines show data flows and broken lines show control flows. The recognition device 30 binarizes or digitizes picture images (namely, pictures) of the conductor pattern 2 and leads 5, stores the pictures thus processed in its picture memories, and subjects such pictures to pattern recognition. In more detail, a digitizer or two-valued A-D converter 301 is a circuit in which a video signal from the television camera 11 is binarized or digitized by the threshold processing using a predetermined threshold value, picture memories 302 and 303 store the picture of the conductor pattern 2 and the picture of the leads 5, respectively, and a control module 304 governs the overall control of the recognition device 30. The control module 304 scans the picture of the conductor pattern 2 stored in the picture memory 302 to detect the X- and Y-coordinates of the center point of each of pads (namely, connecting portions) of the conductor pattern 2, and the module 304 also scans the picture of the leads 5 stored in the picture memory 302 to detect the X- and Y-coordinates of the center point of each lead 5. These X- and Y-coordinates are sent to the controller 26. The controller 26 includes a microprocessor 261, an internal memory 262 and an external memory 263. The internal memory 262 supplies programs and data to the microprocessor 261, and the external memory 263 preliminarily stores reference X- and Y-coordinates of each pad of the conductor pattern 2 as a dictionary. The microprocessor 261 includes a computer for controlling the controller 26 on the whole. The microprocessor 261 receives X- and Y-coordinates of each pad and those of each lead from the recognition device 30, calculates positional deviation values ΔX and ΔY of the component 4 from the conductor pattern 2, and sends the deviation values to the NC driver 29. Also, when the next component is to be mounted, the microprocessor 26 sends the differences between the current X- and Y-coordinates and the X- and Y-coordinates of the next component obtained from the dictionary, to the NC driver 29. The NC driver 29 includes an XY-table driver 292, a loader driver 293, a filter driver 294, a camera driver 295 and a control module 291. The control module 291 controls the NC driver 29 on the whole so that when the X- and Y-coordinate differences or ΔX and ΔY deviations are received from the controller 26, the coordinate differences or deviations are sent to the XY-table driver 292 to move the XY-table, thereby aligning the component 4. Also, the control module 291 is responsive to a command from the controller 26 to move the second filter 13 between its two positions through the filter driver 294, and to rotate the component loader 6 holding the component 4 through the loader driver 293. Further, the control module 291 is responsive to a command from the controller 26 to move the television camera 11 together with the attached lens 10 between the two positions through the camera driver 295. While the construction and operation of each of the recognition device 30, controller 26 and NC driver 29 have been described by way of example, the techniques in this field are well known and therefore various modifications of these units 30, 26 and 29 can be made without departing from the spirit and scope of the invention.

Now, the operation of the present embodiment will be explained below. When the image of the conductor pattern 2 on the printed board 1 is formed and detected, the component loader 6 is rotated to the position indicated by the broken lines 6', and thus the component 4 does not exist above the printed board 1. Further, the focussing lens 10, the television camera 11 and the first filter 12 are disposed as indicated by solid lines in FIG. 1, and the XY-table 20 is moved in the X- and Y-directions through the aid of the NC driver 29 by predetermined amounts, to place the printed board 1 at a position where the next component is to be mounted on the printed board 1. The light 21 which is emitted from the light source 8 and then passes through the lens 9, is incident on the first filter 12. The light 23 having passed through the filter 12 is the exciting light having wavelength components capable of generating fluorescent light from the substrate 3 of the printed board 1 efficiently. The exciting light 23 is reflected from the half mirror 7 so as to illuminate the surface of the printed board 1. As a result, the substrate 3 of the printed board 1 is excited by the exciting light 23, and thus fluorescent light 35 is emitted from the substrate 3. The conductor pattern 2 acts as a mask for the fluorescent light 35. The composite light 38 including the exciting light reflected from the surface of the printed board 1 and the fluorescent light having been subjected to masking passes through the half mirror 7, the focussing lens 10 and the second filter 13, and is focussed on the imaging surface of the television camera 11. Since the second filter 13 cuts off the exciting light component included in the composite light 38, light incident on the television camera 11 includes only the fluorescent light component. Thus, an accurate image of the conductor pattern 2 is formed by the fluorescent light, and detected by the television camera 11.

Figure 4A:
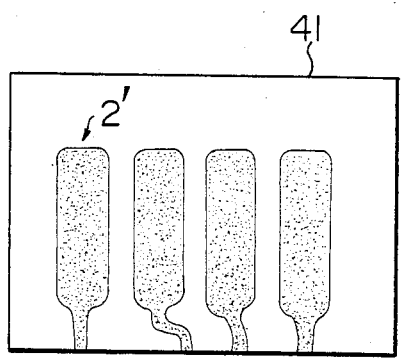
FIGS. 4a and 4b show an image of a conductor pattern and an image of leads of an electronic component, respectively.

The recognition device 30 binarizes the picture of the conductor pattern 2 supplied from the television camera 11, and stores it in the picture memory 302. A resulting picture 41 is shown in FIG. 4a in which a pattern image 2' is detected as black areas and the remainder is detected as a white area.

Next, the image of the leads 5 of the component 4 is formed and detected. In this case, the NC driver 29 is driven under the control of the controller 26, to rotate the component loader 6 so that the component 4 is disposed as indicated by solid lines in FIG. 1, and to move the second filter 13 to the position indicated by broken lines 13', that is, to deviate the filter 13 from the path of the reflected light from the lead 5. Also, the NC driver 29 moves the focussing lens 10 and the television camera 11 to the position indicated by the broken lines 10' and the position indicated by the broken lines 11', respectively, to focus light from the leads 5 on the television camera 11.

Thus, the exciting light 23 reflected from the half mirror 7 impinges on the component 4, and is reflected therefrom. Reflected light 37 from the component 4 passes through the half mirror 7 and the focussing lens 10, and is focussed on the imaging surface of the television camera 11. In this case, light 40 incident upon the camera 11 includes only the exciting light component, and therefore an image of the leads 5 of the component 4 is formed by the exciting light and detected by the television camera 11.

Figure 4B:
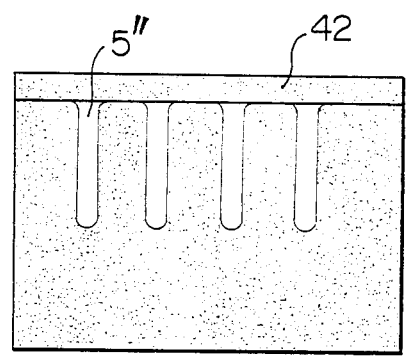

The recognition device 30 binarizes the picture of the leads 5 supplied from the television camera 11 which is placed at the position indicated by the broken lines 11', and stores the resulting picture in the picture memory 303. The resulting picture 42 is shown in FIG. 4b in which portions containing lead image 5" are shown as light intensified areas against the background. The recognition device 30 derives the X- and Y-coordinates of each pad of the conductor pattern 2 and those of each lead from the pictures stored in the picture memories 302 and 303, and sends the above information to the controller 26. The controller 26 calculates positional deviation values ΔX and ΔY of the component 4 with respect to the conductor pattern 2, and sends them as correction values to the NC driver 29. Then, the NC driver 29 moves the XY-table 20, thereby completing the alignment of the component 4 with the printed board 1. After the alignment has been completed, the component loader 6, second filter 13 and television camera 11 are returned to their initial positions through the NC driver 29.

Now, explanation will be made on the wavelength of the exciting light, the wavelength of the fluorescent light, and the wavelength characteristics of the filters 12 and 13.

The substrate 3 of the printed board 1 is typically formed of a glass-polyimide plate or glass-epoxy plate. Light having a wavelength of 500 nm causes the glass-polyimide plate to emit the maximum amount of fluorescent light. Further, the fluorescent light emitted from the glass-polyimide plate lies in a wavelength range from 300 to 800 nm, and has a maximum intensity at a wavelength of 600 nm. Accordingly, in a case where the substrate 3 of the printed board 1 is formed of a glass-polyimide plate, a blue filter which has the highest transmittance for light having a wavelength of 370 to 390 nm and can transmit light having a wavelength shorter than 500 nm, can be used as the first filter 12, and a yellow filter which can transmit light having a wavelength longer than 500 nm and has a transmittance of 50% for light having a wavelength of 520 to 540 nm, can be used as the second filter 13.

In this case, when an argon laser which emits light having a wavelength of 514 or 488 nm is used as the light source 8, the first filter 12 can be omitted.

In a case where the substrate 3 is formed of a glass-epoxy plate, exciting light having a wavelength of 390 nm causes the substrate 3 to emit the maximum amount of fluorescent light. Further, the fluorescent light emitted from the substrate 3 has a maximum intensity at a wavelength of 490 nm, and lies in a wavelength range from 350 to 750 nm. Accordingly, the blue and yellow filters can be used as the first and second filters 12 and 13, respectively, as in the case where the substrate 3 is formed of a glass-polyimide plate.

Figure 5:
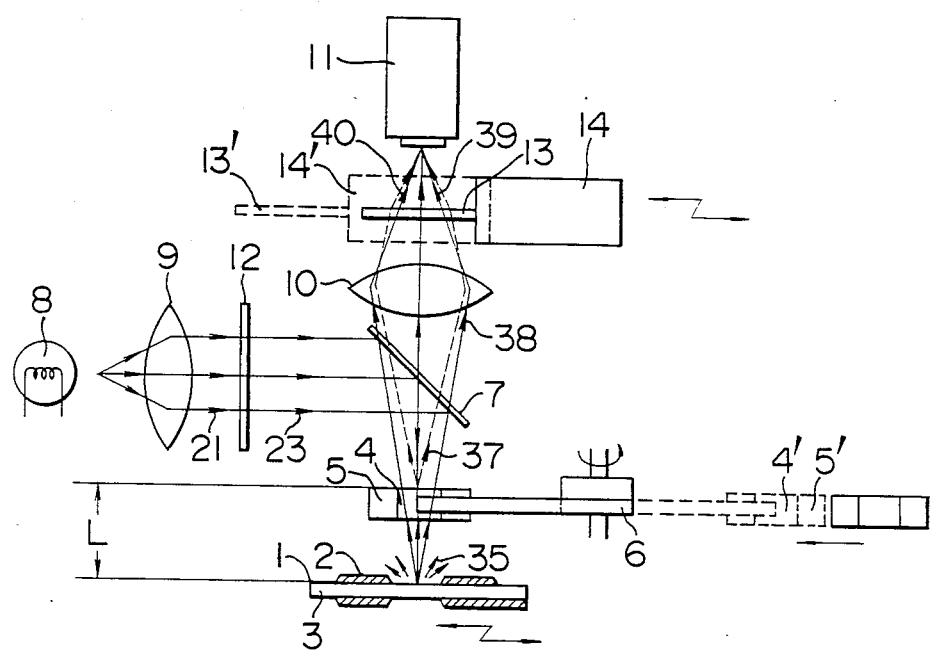
FIG. 5 is a schematic diagram showing another embodiment of a component alignment apparatus according to the present invention.

FIG. 5 schematically shows another embodiment of a component alignment apparatus according to the present invention. The embodiment of FIG. 5 is different from the embodiment of FIG. 1 in that an optical path length adjuster 14 coupled with the second filter 13 is further provided to make it possible to detect the pattern image and the lead image without moving the focussing lens 10 and television camera 11.

In a case where the image of the conductor pattern 2 of the printed board 1 is detected, the optical path length adjuster 14 and the second filter 13 are moved so that the adjuster 14 leaves the path of light incident on the television camera 11 and the filter 13 intersects the path of the above incident light, as indicated by solid lines in FIG. 5. Accordingly, the image of the conductor pattern 2 is formed by the fluorescent light in the same manner as in the embodiment of FIG. 1.

While, in a case where an image of the leads 5 of the component 4 is detected, the distance between the upper surface of the component 4 and the television camera 11 is shorter than the distance between the upper surface of the printed board 1 and the television camera 11 by an amount indicated by reference charater L. Accordingly, in the embodiment of FIG. 1, the television camera 11 and focussing lens 10 are moved upward to focus the reflected light from the leads 5 on the television camera 11. In the embodiment of FIG. 5, instead of moving the television camera 11 and focussing lens 10, the optical path length adjuster 14 is disposed between the television camera 11 and the focussing lens 10 as indicated by broken lines 14', to elongate the optical path between the component 4 and the television camera 11 by an appropriate amount, thereby making it possible to form the image of the leads 5 on the imaging surface of the television camera 11 without moving the camera 11 and focussing lens 10.

In a case where the television camera 11 and the focussing lens 10 are moved, the optical axis of the component alignment apparatus may deviate from a correct position. Thus, images of the conductor pattern and leads may be distorted or the magnification may be varied, and hence the images become unstable. Further, a precise mechanism is required for moving the television camera 11 and the focussing lens 10. In the embodiment of FIG. 5, the television camera 11 and the focussing lens 10 are fixed, and therefore the above problems can be solved.

Figure 6:
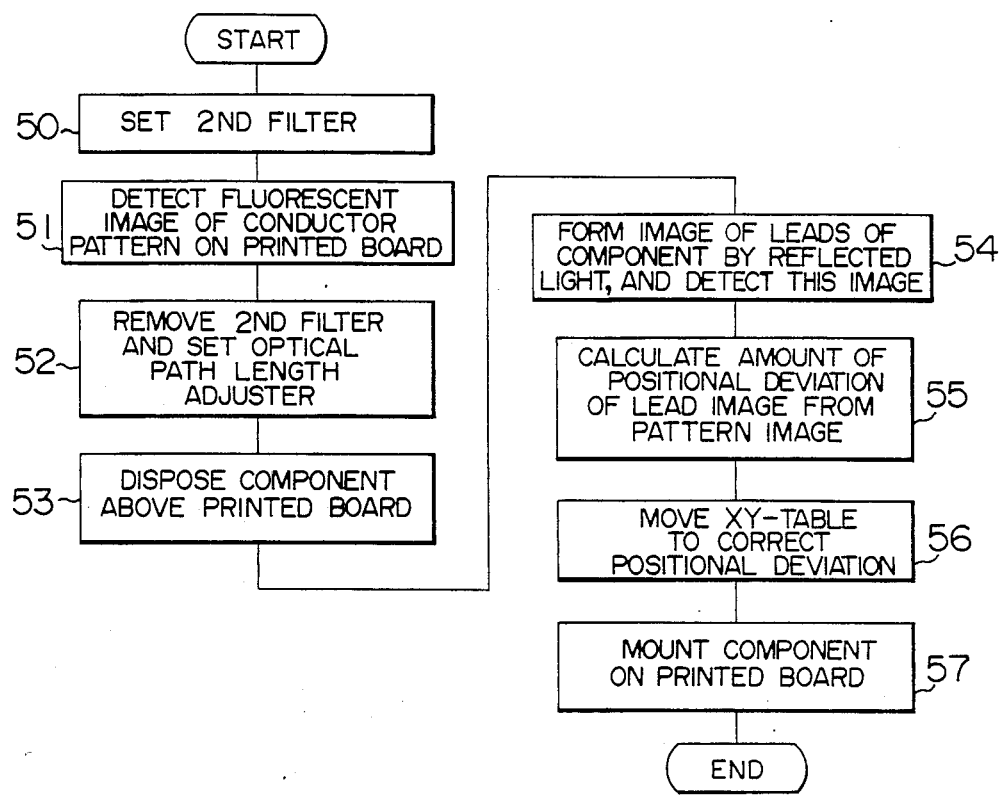
FIG. 6 is a flow chart showing the positioning procedure used in the embodiment of FIG. 5.

The procedure for accurately locating the component 4 in relation to the conductor pattern 2 by using the embodiment of FIG. 5 is shown in FIG. 6. In a final step 57 of FIG. 6, the component 4 which has been accurately located, drops from the component loader 6, to be mounted on the printed board 1.

Figure 7:
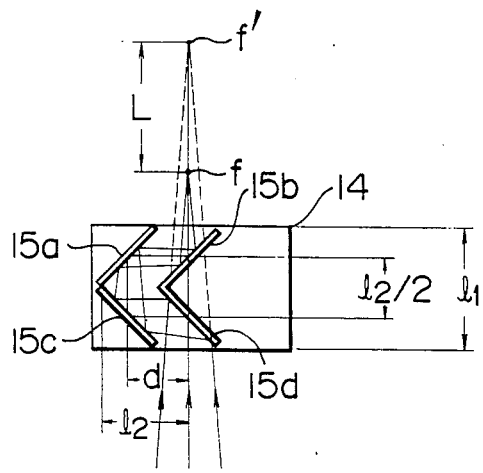
FIG. 7 shows, in section, an example of an optical path length adjuster.

FIG. 7 shows an example of the optical path length adjuster 14. In FIG. 7, reference symbols 15a to 15d designate mirror surfaces. Referring to FIG. 7, the mirror surfaces 15a to 15d are disposed so that the mirror surfaces 15a and 15b face each other and are made parallel to each other, the mirror surfaces 15c and 15d face each other and are made parallel to each other, the mirror surfaces 15a and 15c form a character L, and the mirror surfaces 15b and 15d also form a character L. When the length and half width of the adjuster 14 are expressed by $l_1$ and $l_2$, respectively, the spacing d between parallel mirror surfaces is given by the following equation:

$$d = l_2 - \frac{l_1}{4}$$

Accordingly, the distance L between an image plane f for the conductor pattern 2 and an image plane f' for the upper surface of the component 4 (which is equal to the distance L shown in FIG. 1) is given by the following equation:

$$L = 2d = 2x\left(l_2 - \frac{l_1}{4}\right)$$

In the foregoing, a component alignment apparatus employing a half mirror has been mainly explained. However, a component alignment method which is the gist of the present invention is not always required to use a single light source and a half mirror, as will be shown in the following.

Figure 8:
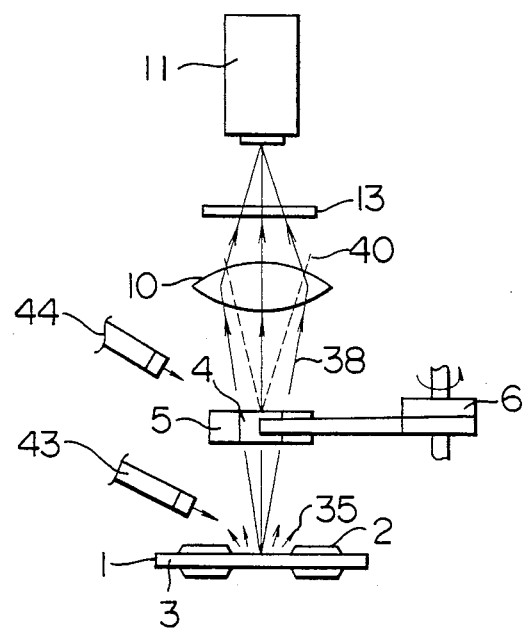
FIG. 8 is a schematic diagram showing a further embodiment of a component alignment apparatus according to the present invention.

FIG. 8 is a schematic diagram showing a further embodiment of a component alignment apparatus according to the present invention. In the present embodiment, the printed board 1 and the leads 5 are illuminated by different light sources. A light source 43 includes an optical fiber for leading exciting light to the surface of the printed board 1, thereby generating fluorescent light from the substrate 3 of the printed board 1. Another light source 44 is used for illuminating the leads 5, thereby generating reflected light therefrom. The embodiment of FIG. 8 has the same construction as the embodiment of FIG. 1, excepting that the light sources 43 and 44 are used instead of the light source 8. Now, the operation of the embodiment of FIG. 8 will be explained below. First, the exciting light emitted from the light source 43 is incident upon the printed board 1 in a state that the component 4 does not exist above the conductor pattern 2, to generate the fluorescent light 35. The composite light 38 including the fluorescent light and the reflected light from the printed board 1 is led to the television camera 11 so that an image of the conductor pattern 2 is formed by the fluorescent light and detected by the camera 11. Next, the component 4 is moved so as to be placed above the conductor pattern 2, and then irradiated with ordinary visible light from the light source 44. The reflected light from the leads 5 of the component 4 is led to the television camera 11 which has been moved to the predetermined position (namely, the position indicated by the broken lines 11' in FIG. 1) so that an image of the leads 5 is formed by the reflected light and detected by the television camera 11.

Figure 9:
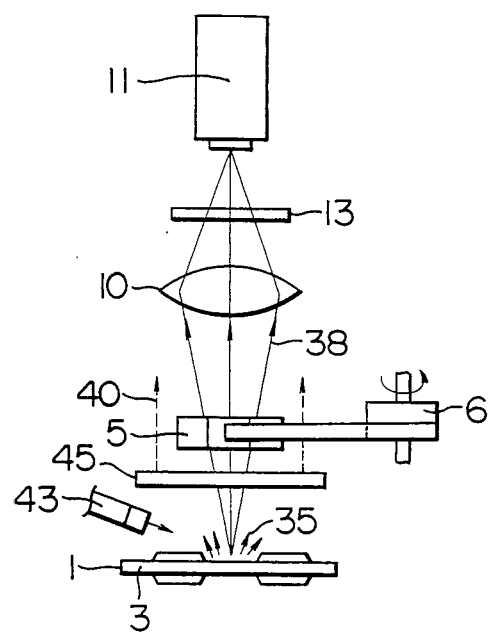
FIG. 9 is a schematic diagram showing still another embodiment of a component alignment apparatus according to the present invention.

FIG. 9 shows still another embodiment of a component alignment apparatus according to the present invention, in which the printed board 1 and the leads 5 are illuminated by different light sources. The embodiment of FIG. 9 is different from the embodiment of FIG. 8 in that an illuminating board 45 for obtaining the silhouette of the leads 5 is used, instead of the light source 44 for generating reflected light from the lead 5. The illuminating board 45 is disposed below the component 4, and emits visible light. That is, the embodiment of FIG.

9 has the same construction as the embodiment of FIG. 8, excepting that the illuminating board 45 is substituted for the light source 44.

Now, the operation of the embodiment of FIG. 9 will be explained below.

First, an image of the conductor pattern 2 is formed by fluorescent light and detected by the television camera 11 in the same manner as in the embodiment of FIG. 8. Thereafter, the component 4 is moved so as to be placed above the conductor pattern 2, and then the illuminating board 45 is interposed between the printed board 1 and the component 4. Thus, light emitted from the illuminating board 45 passes through gaps among the leads 5, and then reaches the television camera 11 which has been moved to the predetermined position (namely, the position indicated by the broken lines 11' in FIG. 1). Thus, the silhouette of the leads 5 is formed by the transmitted light and detected by the television camera 11.

As is evident from the foregoing explanation, according to the present invention, an image of the conductor pattern is formed by the fluorescent light emitted from the substrate of the printed board. Accordingly, even in a case where a flaw is present in the pattern surface, the conductor pattern loses its luster, the conductor pattern has a curved surface which is smooth as the surface of molten solder and reflects a large quantity of light in a specified direction, an accurate image of the conductor pattern can be formed and thus the component can be accurately located in relation to the conductor pattern.

We claim:

1. An apparatus for aligning leads of an electronic component with a conductor pattern of a printed board disposed for mounting the electronic component thereon, said apparatus comprising:
   illuminating means including a single light source for irradiating said printed board and leads of said electronic component with light to generate fluorescent light from said printed board and to obtain reflected light from said leads;
   image detecting means for detecting an image of said conductor pattern when receiving said fluorescent light, and for detecting an image of said leads when receiving said reflected light;
   means for recognizing said pattern image and said lead image, and for computing the amounts of deviation in position therebetween; and
   means for correcting the position of said leads relative to said conductor pattern in accordance with said amounts of deviation.

2. An apparatus according to claim 1, wherein a half mirror is disposed between said illuminating means and said electronic component so that light emitted from said illuminating means is incident on said half mirror in a horizontal direction and reflected downward from said half mirror to impinge on one of said printed board and said electronic component, and one of said fluorescent light from said printed board and said reflected light from said leads of said electronic component passes through said half mirror to travel upward.

3. An apparatus according to claim 1, wherein said image detecting means includes camera means, and a first mirror means is disposed between said illuminating means and said electronic component for enabling light from said single light source be directed toward said printed board and said electronic component and for enabling said fluorescent light from said printed board and said reflected light from said leads of said electronic component to be directed toward said camera means, and optical path length changing means disposed between said first mirror means and said camera means for controlling the optical path length therebetween to enable proper detection of said fluorescent light and said reflected light by said camera means.

4. An apparatus according to claim 3, wherein said optical path length changing means includes second mirror means disposed for movement in an optical path between said first mirror means and said camera means in dependence upon whether one of said fluorescent light and said reflected light is being received by said camera means.

5. An apparatus according to claim 4, wherein said second mirror means comprises two L-shaped mirror members.

6. An apparatus according to claim 5, further comprising a focusing lens disposed between said first mirror means and said optical path length changing means.

7. A method of accurately locating leads of an electronic component in relation to a conductor pattern on a printed board, above the upper side of the conductor pattern by using an image of the leads at an image of the conductor pattern, said method comprising the steps of:
   emitting light from a single light source;
   radiating said printed board and said leads of said electronic component with light from said single light source to generate fluorescent light from said printed board and to obtain reflected light from said leads;
   using detecting means to detect an image of said conductor pattern by receiving said fluorescent light and detecting an image of said leads by receiving said reflected light;
   recognizing said conductor pattern image and said lead image and computing the amounts of deviation in position therebetween; and
   correcting the position of said leads relative to said conductor pattern in accordance with said amounts of deviation.

8. A method according to claim 7, further including the steps of disposing a half mirror in an optical path between said single light source and said electronic component for directing light from said single light source onto said leads of said electronic component and said printed board and for enabling fluorescent light emitted from said printed board to pass through said half mirror and to permit deflected light from said leads of said electronic component to pass through said half mirror.

9. A method according to claim 8, further comprising the steps of disposing camera means for detecting an image of said conductor pattern by receiving said fluorescent light passed through said half mirror and for detecting an image of said leads by receiving said reflected light passed through said half mirror, and disposing optical path length changing means between said half mirror and said camera means, and changing the optical path length of said optical path length changing means in dependence upon whether one of said fluorescent light and said reflected light is being received by said camera means.

* * * * *